US012261409B2

(12) United States Patent
Gerhard et al.

(10) Patent No.: US 12,261,409 B2
(45) Date of Patent: Mar. 25, 2025

(54) EDGE-EMITTING SEMICONDUCTOR LASER DIODE AND METHOD FOR PRODUCING A PLURALITY OF EDGE-EMITTING SEMICONDUCTOR LASER DIODES

(71) Applicant: OSRAM Opto Semiconductors GmbH, Regensburg (DE)

(72) Inventors: Sven Gerhard, Alteglofsheim (DE); Bernhard Stojetz, Wiesent (DE)

(73) Assignee: OSRAM OPTO SEMICONDUCTORS GMB, Regensburg (DE)

( * ) Notice: Subject to any disclaimer, the term of this patent is extended or adjusted under 35 U.S.C. 154(b) by 817 days.

(21) Appl. No.: 17/441,868

(22) PCT Filed: Mar. 11, 2020

(86) PCT No.: PCT/EP2020/056436
§ 371 (c)(1),
(2) Date: Sep. 22, 2021

(87) PCT Pub. No.: WO2020/193131
PCT Pub. Date: Oct. 1, 2020

(65) Prior Publication Data
US 2022/0200241 A1 Jun. 23, 2022

(30) Foreign Application Priority Data
Mar. 27, 2019 (DE) ...................... 10 2019 204 188.4

(51) Int. Cl.
*H01S 5/00* (2006.01)
*H01S 5/02* (2006.01)
(Continued)

(52) U.S. Cl.
CPC .......... *H01S 5/0207* (2013.01); *H01S 5/0014* (2013.01); *H01S 5/1017* (2013.01);
(Continued)

(58) Field of Classification Search
CPC .... H01S 5/0207; H01S 5/0014; H01S 5/1017; H01S 5/1082; H01S 5/12; H01S 5/2022;
(Continued)

(56) References Cited

U.S. PATENT DOCUMENTS 10,193,303 B2 * 1/2019 Taeger ...................... H01S 5/22
2002/0119588 A1 * 8/2002 Bowen .................... H01S 5/227
438/47

(Continued)

FOREIGN PATENT DOCUMENTS

DE 102010015197 A1 1/2012
DE 102012109175 A1 4/2014
(Continued)

OTHER PUBLICATIONS

International Search Report (with English Translation) and Written Opinion in corresponding International Application No. PCT/EP2020/056436 mailed on May 27, 2020, 15 pages.

*Primary Examiner* — Kinam Park
(74) *Attorney, Agent, or Firm* — MH2 Technology Law Group LLP (57) ABSTRACT

The invention relates to an edge-emitting semiconductor laser diode, having: —a semiconductor layer sequence, which comprises a bottom surface, a ridge waveguide on a top surface facing away from the bottom surface, and a side surface which is arranged transverse to the top surface, and —a first recess, which extends from the bottom surface to the top surface, wherein —a first region of the semiconductor layer sequence is removed from the side surface in the region of the first recess. The invention further relates to a (Continued)

method for producing a plurality of edge-emitting semiconductor laser diodes.

16 Claims, 6 Drawing Sheets

(51) Int. Cl.
| | | |
|---|---|---|
| *H01S 5/10* | (2021.01) | |
| *H01S 5/12* | (2021.01) | |
| *H01S 5/20* | (2006.01) | |
| *H01S 5/22* | (2006.01) | |
| *H01S 5/026* | (2006.01) | |

(52) U.S. Cl.
CPC .............. *H01S 5/1082* (2013.01); *H01S 5/12* (2013.01); *H01S 5/2022* (2013.01); *H01S 5/2027* (2013.01); *H01S 5/22* (2013.01); *H01S 5/0087* (2021.01); *H01S 5/0201* (2013.01); *H01S 5/026* (2013.01); *H01S 2301/166* (2013.01)

(58) Field of Classification Search
CPC ........ H01S 5/2027; H01S 5/22; H01S 5/0087; H01S 5/0201; H01S 5/026; H01S 2301/166
See application file for complete search history.

(56) References Cited

U.S. PATENT DOCUMENTS

| | | | | |
|---|---|---|---|---|
| 2003/0123335 | A1* | 7/2003 | Rettner | G11B 5/3103 |
| 2005/0254355 | A1* | 11/2005 | Rettner | G11B 5/127 |
| | | | | 369/13.02 |
| 2009/0262771 | A1* | 10/2009 | Inoue | B82Y 20/00 |
| | | | | 438/33 |
| 2011/0080929 | A1* | 4/2011 | Onozawa | H01S 5/22 |
| | | | | 438/33 |
| 2011/0134948 | A1* | 6/2011 | Kawakami | H01S 5/04252 |
| | | | | 372/46.01 |
| 2011/0142090 | A1* | 6/2011 | Yokozeki | B82Y 20/00 |
| | | | | 438/33 |
| 2012/0183007 | A1* | 7/2012 | Roggero | H01S 5/185 |
| | | | | 372/50.23 |
| 2013/0107534 | A1* | 5/2013 | Avramescu | H01S 5/02461 |
| | | | | 362/259 |
| 2013/0230068 | A1* | 9/2013 | Lell | H01S 5/2202 |
| | | | | 438/42 |
| 2019/0173262 | A1* | 6/2019 | Ono | H01S 5/0206 |
| 2020/0098820 | A1* | 3/2020 | Zhang | H01L 33/12 |

FOREIGN PATENT DOCUMENTS

| | | |
|---|---|---|
| WO | 2017220325 A1 | 12/2017 |
| WO | 2018119814 A1 | 7/2018 |

* cited by examiner

EDGE-EMITTING SEMICONDUCTOR LASER DIODE AND METHOD FOR PRODUCING A PLURALITY OF EDGE-EMITTING SEMICONDUCTOR LASER DIODES

CROSS-REFERENCE TO RELATED APPLICATIONS

This patent application is a national stage entry from International Application No. PCT/EP2020/056436, filed on Mar. 11, 2020, published as International Publication No. WO 2020/193131 A1 on Oct. 1, 2020, and claims priority under 35 U.S.C. § 119 from German patent application 10 2019 204 188.4, filed Mar. 27, 2019, the entire contents of all of which are incorporated by reference herein.

FIELD

An edge emitting semiconductor laser diode is specified. Furthermore, a method for producing an edge emitting semiconductor laser diode is specified.

BACKGROUND

One object to be achieved exists in specifying an edge emitting semiconductor laser diode which is controllable in a particularly simple manner. A further object to be achieved consists in specifying a method for producing such an edge emitting semiconductor laser diode.

During operation, the edge emitting semiconductor laser diode emits electromagnetic radiation, for example, such as monochromatic and coherent laser light. The electromagnetic radiation is generated for example in the frequency range from infrared radiation to UV radiation.

SUMMARY

In accordance with at least one embodiment, the edge emitting semiconductor laser diode comprises a semiconductor layer sequence comprising a bottom surface, a ridge waveguide at a top surface facing away from the bottom surface, and a side surface arranged transversely with respect to the top surface. By way of example, the semiconductor layer sequence comprises a plurality of semiconductor layers and an active layer, which is configured to generate electromagnetic radiation during operation. By way of example, the active layer can comprise a pn junction, a double heterostructure, a single quantum well structure or a multiple quantum well structure for generating radiation.

The semiconductor layer sequence is formed from a III-V compound semiconductor material, for example, or comprises a III-V compound semiconductor material. The III-V compound semiconductor material can be a nitride compound semiconductor material or a phosphide compound semiconductor material.

Nitride compound semiconductor materials are compound semiconductor materials containing nitrogen, such as the materials from the system $In_xAl_yGa_{1-x-y}N$ where $0 \leq x \leq 0$, $0 \leq y \leq 1$ and $x+y \leq 1$. By way of example, InAlGaN is a nitride compound semiconductor material. Semiconductor layer sequences comprising an active layer which are formed from a nitride compound semiconductor material or comprise a nitride compound semiconductor material generally generate electromagnetic radiation in an ultraviolet to green wavelength range.

Phosphide compound semiconductor materials are compound semiconductor materials containing phosphorus, such as the materials from the system $In_xAl_yGa_{1-x-y}P$ where $0 \leq x \leq 1$, $0 \leq y \leq 1$ and $x+y \leq 1$. By way of example, InAlGaP is a phosphide compound semiconductor material. Semiconductor layer sequences comprising an active layer which are formed from a phosphide compound semiconductor material or comprise a phosphide compound semiconductor material generally generate electromagnetic radiation in a green to red wavelength range.

The edge emitting semiconductor laser diode has a main plane of extent. Lateral directions are oriented parallel to the main plane of extent, for example, and a vertical direction is oriented perpendicular to the lateral directions. The bottom surface of the semiconductor layer sequence and the opposite top surface of the semiconductor layer sequence extend parallel to the main plane of extent, for example. The side surface of the semiconductor layer sequence is substantially perpendicular to the main plane of extent, for example. Substantially perpendicular means that the side surface is inclined at most by +/−5% with respect to the normal to the main plane of extent.

The semiconductor layer sequence extends in a lateral direction between a rear side surface and a front surface along a longitudinal direction running parallel to the main plane of extent. The rear side surface and the front surface are arranged transversely with respect to the bottom surface, the top surface and the side surface of the semiconductor layer sequence. By way of example, the rear side surface and the front surface of the semiconductor layer sequence are substantially perpendicular to the main plane of extent, for example. Substantially perpendicular means that the rear side surface and the front surface are inclined in each case at most by +/−5° with respect to the normal to the main plane of extent.

The ridge waveguide is formed for example by a ridge-shaped elevated region of the semiconductor layer sequence. By way of example, the ridge waveguide protrudes as a projection from a recessed top surface of the semiconductor layer sequence. The ridge waveguide has for example a top surface and side surfaces adjoining the latter. The top surface of the ridge waveguide is connected, for example directly, via the side surfaces adjoining it to the recessed top surface of the semiconductor layer sequence arranged laterally with respect to the ridge waveguide. The top surface of the semiconductor layer sequence is formed for example by the recessed top surface of the semiconductor layer sequence, the side surfaces of the ridge waveguide and the top surface of the ridge waveguide. The ridge waveguide extends for example in a longitudinal direction from the rear side surface to the front surface.

The active layer is arranged below the ridge waveguide, for example. In this case, the active layer also runs below the recessed top surface of the semiconductor layer sequence, for example.

Alternatively, it is possible for the active layer to be arranged between the side surfaces of the ridge waveguide. In this case, the semiconductor layer sequence below the recessed top surface of the semiconductor layer sequence is free of the active layer, for example.

The semiconductor layer sequence comprises for example at least one first semiconductor layer of a first conductivity type and at least one second semiconductor layer of a second, different conductivity type. By way of example, the first semiconductor layer is embodied as p-doped and thus p-conducting. Furthermore, the second semiconductor layer is embodied for example as n-doped and thus n-conducting.

The first semiconductor layer and the second semiconductor layer are preferably stacked one above another in a vertical direction. The active layer is arranged between the first semiconductor layer and the second semiconductor layer, for example. The bottom surface of the semiconductor layer sequence is formed by a bottom surface of the second semiconductor layer, for example. In this case, at least the top surface of the ridge waveguide is formed by a top surface of the first semiconductor layer, for example.

The edge emitting semiconductor laser diode emits laser radiation from a facet. The facet is formed by at least one part of the front surface of the semiconductor layer sequence. That is to say that the facet is a part of the front surface. By way of example, the facet is formed by a region around the active layer at the front surface.

In accordance with at least one embodiment, the edge emitting semiconductor laser diode comprises a first cutout extending from the bottom surface toward the top surface. By way of example, the first cutout extends from the bottom surface toward the recessed top surface of the semiconductor layer sequence.

The first cutout penetrates through the semiconductor layer sequence from the bottom surface to the recessed top surface of the semiconductor layer sequence for example only partly. It is possible for the first cutout to partly penetrate through the second semiconductor layer. If the active layer is arranged below the ridge waveguide, for example, it is possible for the first cutout to completely penetrate through the second semiconductor layer and the active layer. In this case, the first cutout penetrates partly through the first semiconductor layer, for example.

Alternatively, the first cutout can for example completely penetrate through the semiconductor layer sequence from the bottom surface to the recessed top surface of the semiconductor layer sequence. In this case, the first cutout penetrates completely through the second semiconductor layer. If the active layer is arranged below the ridge waveguide, for example, it is possible for the first cutout to completely penetrate through the second semiconductor layer and the active layer. In this case, the first cutout penetrates through the first semiconductor layer as far as the recessed top surface of the semiconductor layer.

In accordance with at least one embodiment, a first region of the semiconductor layer sequence is removed from the side surface in the first region of the first cutout. The first cutout exposes a recessed side surface of the semiconductor layer sequence, for example.

If the first cutout penetrates through the semiconductor layer sequence from the bottom surface to the recessed top surface only partly, the first cutout exposes a recessed bottom surface of the semiconductor layer sequence, for example. By way of example, the side surface of the semiconductor layer sequence, the recessed bottom surface of the semiconductor layer sequence, the recessed side surface of the semiconductor layer sequence and the bottom surface of the semiconductor layer sequence form a step profile.

If the first cutout penetrates through the semiconductor layer sequence from the bottom surface to the recessed top surface only partly, a side surface of the first cutout that faces the semiconductor layer sequence is formed by the recessed side surface of the second semiconductor layer, for example. If the active layer is arranged below the ridge waveguide, for example, it is possible for the side surface of the first cutout to be formed by the recessed side surface of the second semiconductor layer, the active layer and a recessed side surface of the first semiconductor layer.

If the first cutout extends for example completely from the bottom surface of the semiconductor layer sequence as far as the recessed top surface of the semiconductor layer sequence, the side surface of the first cutout that faces the semiconductor layer sequence is formed by the recessed side surface of the second semiconductor layer, for example. If the active layer is arranged below the ridge waveguide, for example, the side surface of the first cutout that faces the semiconductor layer sequence is formed by the second semiconductor layer, the active layer and the first semiconductor layer, for example.

A further side surface of the first cutout facing away from the semiconductor layer sequence is in particular free of any material of the semiconductor layer sequence.

In at least one embodiment, the edge emitting semiconductor laser diode comprises a semiconductor layer sequence comprising a bottom surface, a ridge waveguide at a top surface facing away from the bottom surface, and a side surface arranged transversely with respect to the top surface. Furthermore, the edge emitting semiconductor laser diode comprises a first cutout extending from the bottom surface toward the top surface. In addition, a first region of the semiconductor layer sequence is removed from the side surface in the region of the first cutout.

In accordance with at least one embodiment, a side surface of the semiconductor layer sequence that is recessed by the first cutout has a roughened surface. Regions of the roughened surface preferably have elevations and depressions. By way of example, the recessed side surface of the second semiconductor layer has a roughened surface as a result of the removal of the material of the second semiconductor layer. Furthermore, the first semiconductor layer can have a roughened surface as a result of the removal of the material of the first semiconductor layer. The roughened surface is configured for example to scatter electromagnetic radiation, in particular visible light.

One concept of the edge emitting semiconductor laser diode described here is, inter alia, that the first cutout extends from a bottom surface of the semiconductor layer sequence to a top surface of the semiconductor layer sequence. A resultant recessed side surface of the semiconductor layer sequence can have a roughened surface, for example.

Generally, during optical control of a facet, visible light is radiated onto the facet. The light can also propagate in the semiconductor layer sequence, which can lead for example to disturbing reflections and thus hamper optical recognition of the facet. By virtue of the roughened surface of the recessed side surfaces, these reflections are advantageously reduced and a facet is thus controllable in a particularly simple manner.

In accordance with at least one embodiment, the first cutout extends in places along a length of the semiconductor laser diode. The length of the semiconductor laser diode corresponds to a largest extent of the cross-sectional area of the semiconductor laser diode in a direction parallel to the main plane of extent, for example in a longitudinal direction. By way of example, the length is the distance between two mutually opposite inner sides of the semiconductor laser diode, for example the rear side surface of the semiconductor layer sequence and the front surface of the semiconductor layer sequence.

In accordance with this embodiment, the first cutout has a length which is less than the length of the semiconductor laser diode. The first cutout does not directly adjoin the rear side surface and the front surface of the semiconductor layer sequence, for example. That is to say that the first cutout is spaced apart from the rear side surface and the front surface of the semiconductor layer sequence for example in lateral directions, in particular in a longitudinal direction.

In accordance with at least one embodiment, the first cutout extends completely along a length of the semiconductor laser diode. In this case, the first region of the semiconductor layer sequence is removed from the front surface for example in the region of the first cutout. Furthermore, the first region of the semiconductor layer sequence is removed for example from the rear side surface in the region of the first cutout. In accordance with this embodiment, the first cutout exposes a recessed front surface of the semiconductor layer sequence, for example.

By way of example, the front surface of the semiconductor layer sequence that is recessed by the first cutout has the roughened surface, comprising elevations and depressions.

By way of example, it is possible for the first cutout, in a first sector, to penetrate for example partly through the semiconductor layer sequence from the bottom surface to the recessed top surface of the semiconductor layer sequence. Furthermore, it is possible for the first cutout, in a second sector, to penetrate for example completely through the semiconductor layer sequence from the bottom surface to the recessed top surface of the semiconductor layer sequence. The first sector and the second sector can directly adjoint one another, for example.

Furthermore, the first cutout can have for example a plurality of first sectors and a plurality of second sectors, which can be arranged alternately for example along the length of the edge emitting semiconductor laser diode.

Furthermore, it is possible for the second sector to adjoin the front surface. In this case, the first sector extends along the remaining length of the semiconductor laser diode.

A semiconductor laser diode having the first sector and the second sector advantageously has an improved stability compared with a semiconductor laser diode in which the first cutout for example penetrates completely through the semiconductor layer sequence from the bottom surface to the recessed top surface of the semiconductor layer sequence and extends completely along the length of the semiconductor laser diode.

In accordance with at least one embodiment, a second cutout extends from the bottom surface toward the top surface of the semiconductor layer sequence.

The second cutout penetrates for example only partly through the semiconductor layer sequence from the bottom surface to the top surface of the semiconductor layer sequence. The second cutout partly penetrates through the second semiconductor layer, for example. The second cutout does not penetrate through the active layer, for example.

In accordance with at least one embodiment, a second region of the semiconductor layer sequence is removed from the front surface in the region of the second cutout, said second region adjoining the first region. The second cutout exposes a recessed front surface of the semiconductor layer sequence, for example.

The second cutout exposes a further recessed bottom surface of the semiconductor layer sequence, for example. By way of example, the front surface of the semiconductor layer sequence, the further recessed bottom surface of the semiconductor layer sequence, the recessed front surface of the semiconductor layer sequence and the bottom surface of the semiconductor layer sequence form a further step profile.

A side surface of the second cutout that faces the semiconductor layer sequence is formed by the recessed front surface of the second semiconductor layer, for example. A further side surface of the second cutout facing away from the semiconductor layer sequence is free of any material of the semiconductor layer sequence, for example.

By way of example, a front surface of the semiconductor layer sequence that is recessed by the second cutout has a roughened surface, comprising elevations and depressions.

In accordance with at least one embodiment, the second cutout extends in places along a width of the semiconductor laser diode. The width of the semiconductor laser diode corresponds to a smallest extent of the cross-sectional area of the semiconductor laser diode in a direction parallel to the main plane of extent, for example perpendicular to the longitudinal direction. By way of example, the width is the distance between two mutually opposite inner sides of the semiconductor laser diode, for example the side surfaces of the semiconductor layer sequence.

Furthermore, the first region of the first cutout directly adjoins the second region of the second cutout. The second cutout thus extends between the recessed side surfaces of the semiconductor layer sequence, for example. The first cutout and the second cutout extend completely along the width of the semiconductor laser diode, for example.

In accordance with at least one embodiment, in plan view the ridge waveguide regionally overlaps the second cutout in lateral directions. The ridge waveguide projects beyond the recessed front surface of the semiconductor layer sequence in lateral directions, for example. In accordance with this embodiment, the second cutout partly penetrates through the second semiconductor layer. The second cutout does not penetrate through the active layer, for example. Preferably, no material of the semiconductor layer sequence is thus removed by the second cutout in the region of the facet.

In accordance with at least one embodiment, in plan view the first cutout does not overlap the ridge waveguide in lateral directions. In plan view, for example, the ridge waveguide is arranged between two mutually opposite recessed side surfaces of the semiconductor layer sequence.

In accordance with at least one embodiment, a filling material is arranged in the first cutout. By way of example, the filling material completely fills the first cutout. A bottom surface of the filling material terminates for example in planar fashion with the bottom surface of the semiconductor layer sequence. Furthermore, a side surface of the filling material that faces away from the recessed side surface of the semiconductor layer sequence terminates in planar fashion with the side surface of the semiconductor layer sequence. Furthermore, the filling material is in direct contact with the semiconductor layer sequence, for example.

Furthermore, a filling material is arranged in the second cutout, for example. By way of example, the filling material completely fills the second cutout. Furthermore, a side surface of the filling material that faces away from the recessed front surface of the semiconductor layer sequence terminates in planar fashion with the front surface of the semiconductor layer sequence.

In accordance with at least one embodiment, the filling material has a refractive index which is different than a refractive index of the semiconductor layer sequence. The filling material comprises for example a dielectric material or a semiconducting material. The filling material comprises for example Si, Ge or GaAs.

In accordance with at least one embodiment, the filling material comprises a radiation-absorbing material or a radiation-reflecting material which is absorbent or reflective for laser radiation. The filling material preferably comprises a matrix material with a multiplicity of particles introduced therein. The matrix material can be for example a resin such as an epoxy or a silicone or a mixture of these materials, or a ceramic material.

By way of example, reflective particles are introduced into the matrix material. The reflective particles are embodied as reflective for visible light and/or the laser radiation, for example. The reflective particles comprise one of the following materials, for example, or are formed by one of the following materials: TiO2, SiO2, MfO2. In this case, the filling material is configured to reflect for example at least 90% or at least 95% of the laser radiation.

Alternatively or additionally, absorbent particles can be introduced into the matrix material, for example. The absorbent particles can absorb visible light and/or the laser radiation, for example. In this case, the filling material has an absorption coefficient of at least 100 $cm^{-1}$ or at least 1000 $cm^{-1}$, for example.

In accordance with at least one embodiment, the filling material comprises a conversion material configured to convert laser radiation into electromagnetic secondary radiation of a different wavelength. By way of example, the electromagnetic secondary radiation has longer wavelengths than the laser radiation. By way of example, phosphor particles are introduced into the matrix material. In this case, the phosphor particles impart the wavelength-converting properties to the conversion material.

By way of example, one of the following materials is suitable for the phosphor particles: garnets doped with rare earths, alkaline earth metal sulfides doped with rare earths, thiogallates doped with rare earths, aluminates doped with rare earths, silicates doped with rare earths, orthosilicates doped with rare earths, chlorosilicates doped with rare earths, alkaline earth metal silicon nitrides doped with rare earths, oxynitrides doped with rare earths, aluminum oxynitrides doped with rare earths, silicon nitrides doped with rare earths, sialons doped with rare earths, quantum dot phosphors. The phosphor particles can also be used without the matrix material.

In accordance with at least one embodiment, there is arranged in the first cutout at least one sensor element configured to detect at least one of the following variables: electromagnetic radiation, electrical resistance, mechanical force, temperature.

Electromagnetic radiation can be detected for example by a semiconductor detector chip such as a photodiode chip, for instance. The electrical resistance can be detected by a doped semiconductor layer, for example. The mechanical force can be detected by a piezo-element, for example. The temperature is detected by a peltier element, for example.

By way of example, a plurality of sensor elements can be arranged in the first cutout. By way of example, the sensor elements are arranged next to one another in lateral directions in the first cutout. Bottom surfaces of the sensor elements lie for example in a common plane with the bottom surface of the semiconductor layer sequence. A side surface of an outermost sensor element facing away from the recessed side surface of the semiconductor layer sequence can terminate for example in planar fashion with the side surface of the semiconductor layer sequence.

Furthermore, besides at least one sensor element, the filling material can be arranged in the cutout. If the sensor element is embodied as sensitive to light, for example, the filling material can be arranged between the sensor element and the semiconductor layer sequence.

Furthermore, the filling material can be embodied as electrically insulating, for example. By way of example, the filling material can be arranged between at least two sensor elements and electrically insulate the latter from one another.

In accordance with at least one embodiment, a third cutout extends from the bottom surface toward the top surface of the semiconductor layer sequence. The third cutout penetrates for example only partly through the semiconductor layer sequence from the bottom surface to the top surface of the semiconductor layer sequence. The third cutout partly penetrates through the second semiconductor layer, for example. By way of example, the third cutout does not penetrate through the active layer.

The third cutout has a triangular shape, a quadrilateral shape, a hexagonal shape, a round shape, an oval shape or an elliptical shape, for example. A maximum extent in a longitudinal direction of the third cutout is less than the length of the semiconductor laser diode, for example. Furthermore, the maximum extent perpendicular to the longitudinal direction of the third cutout is less than the width of the semiconductor laser diode, for example.

In accordance with at least one embodiment, the third cutout is laterally completely surrounded by a material of the semiconductor layer sequence. Furthermore, the third cutout is spaced apart from the first cutout in lateral directions, for example.

Furthermore, by way of example, a plurality of third cutouts can extend from the bottom surface toward the top surface of the semiconductor layer sequence. In this case, the third cutouts are arranged in a manner spaced apart from one another in lateral directions. In this case, each of the third cutouts is completely surrounded by the material of the semiconductor layer sequence, for example.

It is possible for the third cutouts to be arranged with equidistant spacings along the longitudinal directions.

Furthermore, it is possible for the third cutouts to extend parallel to the longitudinal direction. By way of example, the third cutouts extend completely along a length of the semiconductor laser diode.

In accordance with at least one embodiment, in plan view the third cutout overlaps the ridge waveguide. If the semiconductor laser diode comprises the plurality of third cutouts, all third cutouts overlap the ridge waveguide in plan view.

In accordance with at least one embodiment, a further filling material is arranged in the third cutout. If the edge emitting semiconductor laser diode comprises the plurality of third cutouts, for example, the further filling material can be arranged in each third cutout. The further filling material completely fills the third cutouts, for example, and is in direct contact with the semiconductor layer sequence, for example. By way of example, the further filling material is in direct contact with the second semiconductor layer sequence. The further filling material can for example comprise the same materials or be formed from the same materials as the filling material described here.

By way of example, the further filling material has a refractive index which is different than a refractive index of the semiconductor layer sequence.

Current is impressed into the semiconductor layer sequence for example via an electrical contacting at the top surface of the ridge waveguide, for example via the p-doped first semiconductor layer. If the active layer is arranged below the recessed outer surface of the semiconductor layer sequence, the active layer is energized substantially only in the region below the ridge waveguide and generates electromagnetic radiation only in this region. The energized region of the active layer is formed by an active region. In this case, the active region is arranged substantially only in the region below the ridge waveguide and is substantially delimited by the side surfaces of the ridge waveguide in lateral directions. Substantially means here that the impressed current can be spread below the ridge waveguide and projects beyond the side surfaces of the ridge waveguide in lateral directions.

The laser radiation generated during the operation of the semiconductor laser diode has for example a single optical mode or a plurality of optical modes that decay exponentially outside the active region. It is possible for the at least one mode to extend into the second semiconductor layer in a vertical direction, for example. At least one mode of the laser radiation thus has an extent in a vertical direction which projects right into the second semiconductor layer.

It is furthermore possible for the at least one third cutout with the further filling material, in a side view, to overlap the at least one mode of the laser radiation in a vertical direction. That is to say that the intensity of the laser radiation at an interface in a vertical direction between the second semiconductor layer and the at least one third cutout is greater than 0 if the laser radiation extends into the at least one third cutout. By way of example, the intensity of the laser radiation at the interface has a value of greater than or equal to 0.05%, in particular greater than or equal to 0.1% or greater than or equal to 0.5% of the maximum of the intensity of the laser radiation.

By way of example, the at least one mode of the laser radiation which is generated in the active region can advantageously be blocked or guided in a targeted manner. Furthermore, a distributed feedback laser ("DFB laser" for short) can advantageously be realized by means of the third cutouts filled with the further filling material.

The sudden change in the refractive index at the interface between the second semiconductor layer and the further filling material in a vertical direction and/or lateral directions can bring about so-called index guiding of the laser radiation. That is to say that the sudden change in the refractive index brings about waveguiding of the electromagnetic radiation generated in the active region in the vertical direction and/or lateral directions and thus contributes to the formation of laser modes.

Furthermore, a method for producing a plurality of edge emitting semiconductor laser diodes is specified. This method is suitable in particular for producing an edge emitting semiconductor laser described here. That is to say that an edge emitting semiconductor laser described here is producible by the method described or is produced by the method described. Therefore, all features disclosed in association with the edge emitting semiconductor laser are also disclosed in association with the method, and vice versa.

In accordance with at least one embodiment of the method, a semiconductor wafer is provided, comprising a bottom surface and a plurality of ridge waveguides at a top surface facing away from the bottom surface. The semiconductor wafer comprises a semiconductor layer sequence described here, for example.

The ridge waveguides extend for example along a direction in lateral directions over an entire length of the semiconductor wafer. The ridge waveguides are arranged parallel to one another, for example.

In accordance with at least one embodiment of the method, a plurality of first cutouts extending from the bottom surface toward the top surface are produced. A first cutout of the plurality of first cutouts is assigned to two semiconductor laser diodes to be produced, for example.

In accordance with at least one embodiment of the method, the semiconductor wafer is singulated to form semiconductor laser diodes through the first cutouts. By way of example, before the semiconductor wafer is singulated to form semiconductor laser diodes, a filling material can be introduced into the first cutouts. In this case, the semiconductor wafer is singulated to form semiconductor laser diodes through the filling material.

If the first cutouts are filled with the filling material, an electrical contacting can subsequently be produced on the bottom surface of the semiconductor wafer. The electrical contacting is embodied as electrically conductive, for example, and comprises a metal, for example. The electrical contacting can comprise or consist of one of the following materials, for example: Ti, Pt, Au, ZnO, ITO, Cr, Od, Ni.

In accordance with at least one embodiment, the first cutouts are produced by means of one of the following processes: laser scribing, sawing, plasma etching, photoelectrochemical etching. A recessed surface of the semiconductor layer sequence is produced by means of such processes, such that this recessed surface has roughenings.

The edge emitting semiconductor laser diode described here and the method described here are explained in greater detail below on the basis of exemplary embodiments and with reference to the associated figures.

DETAILED DESCRIPTION

Elements that are identical, of identical type or act identically are provided with the same reference signs in the figures. The figures and the size relationships of the elements illustrated in the figures among one another should not be regarded as to scale. Rather, individual elements may be illustrated with exaggerated size in order to enable better illustration and/or in order to afford a better understanding.

Figure 1:
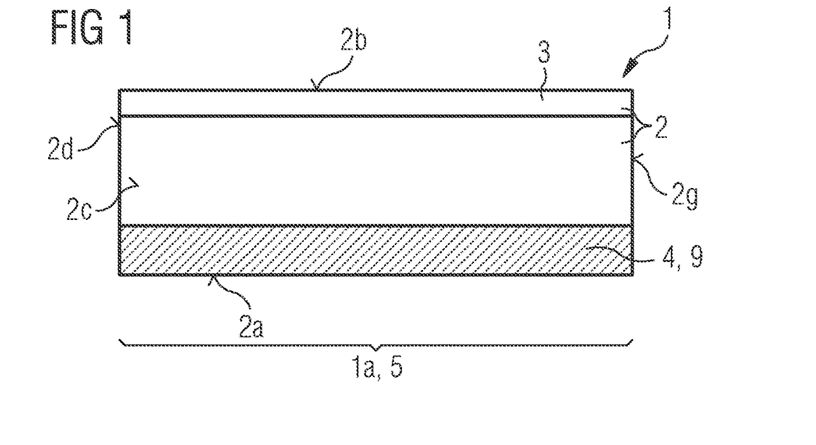
FIGS. 1 and 2 show schematic illustrations of one exemplary embodiment of an edge emitting semiconductor laser diode described here.
Figure 2:
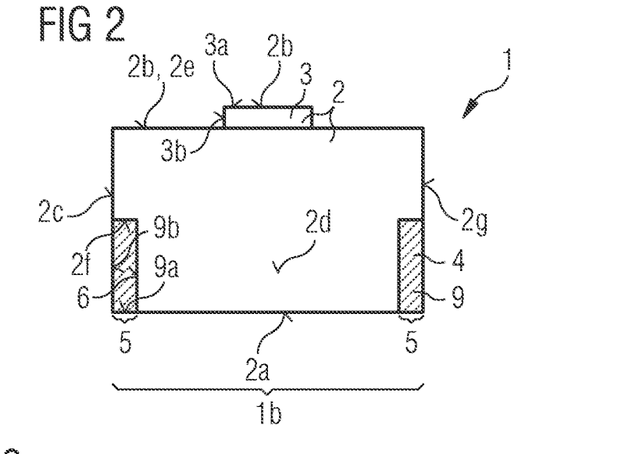

Schematic illustrations of an edge emitting semiconductor laser diode 1 in accordance with one exemplary embodiment are illustrated in accordance with FIGS. 1 and 2.

In accordance with FIG. 1, a side view of the edge emitting semiconductor laser diode 1 comprising a semiconductor layer sequence 2 is illustrated. The semiconductor layer sequence 2 comprises a bottom surface 2a, a ridge waveguide 3 at a top surface 2b facing away from the bottom surface 2a, and a side surface 2c arranged transversely with respect to the top surface 2b.

Furthermore, a first cutout 4 is arranged in the semiconductor layer sequence 2. The first cutout 4 extends from the bottom surface 2a toward the top surface 2b of the semiconductor layer sequence 2. The first cutout 4 only partly penetrates through the semiconductor layer sequence 2 from the bottom surface to the recessed top surface of the semiconductor layer sequence 2e.

The first cutout 4 extends completely along a length of the semiconductor laser diode 1a. The first cutout 4 extends in lateral directions completely from a rear side surface 2g, situated opposite the front surface 2d, to the front surface of the semiconductor layer sequence 2d. Furthermore, a filling material 9 is arranged in the first cutout 4 and completely fills the first cutout 4.

A front view of the edge emitting semiconductor laser diode 1 is illustrated in association with the exemplary embodiment in FIG. 2.

The ridge waveguide 3 is formed by a ridge-shaped elevated region of the semiconductor layer sequence 2. The ridge waveguide 3 protrudes as a projection from a recessed top surface of the semiconductor layer sequence 2e. The ridge waveguide 3 has a top surface 3a and side surfaces 3b adjoining the latter. The top surface of the semiconductor layer sequence 2b is formed by the recessed top surface of the semiconductor layer sequence 2e, the side surfaces of the ridge waveguide 3b and the top surface of the ridge waveguide 3a.

A first region of the semiconductor layer sequence 5 is removed from the side surface 2c in the region of the first cutout 5. The first cutout 4 thus exposes a recessed side surface of the semiconductor layer sequence 6. Furthermore, the first region of the semiconductor layer sequence 5 is removed from the front surface 2d in the region of the first cutout 4. The first cutout 4 thus exposes a recessed bottom surface of the semiconductor layer sequence 2f. The side surface of the semiconductor layer sequence 2c, the recessed bottom surface of the semiconductor layer sequence 2f, the recessed side surface of the semiconductor layer sequence 6 and the bottom surface of the semiconductor layer sequence 2a form a step profile.

In accordance with this exemplary embodiment, the first cutout 4 is completely filled with the filling material 9. A bottom surface of the filling material 9a terminates in planar fashion with the bottom surface of the semiconductor layer sequence 2a. Furthermore, a side surface of the filling material 9b that faces away from the recessed side surface of the semiconductor layer sequence 6 terminates in planar fashion with the side surface of the semiconductor layer sequence 2c.

Figure 3:
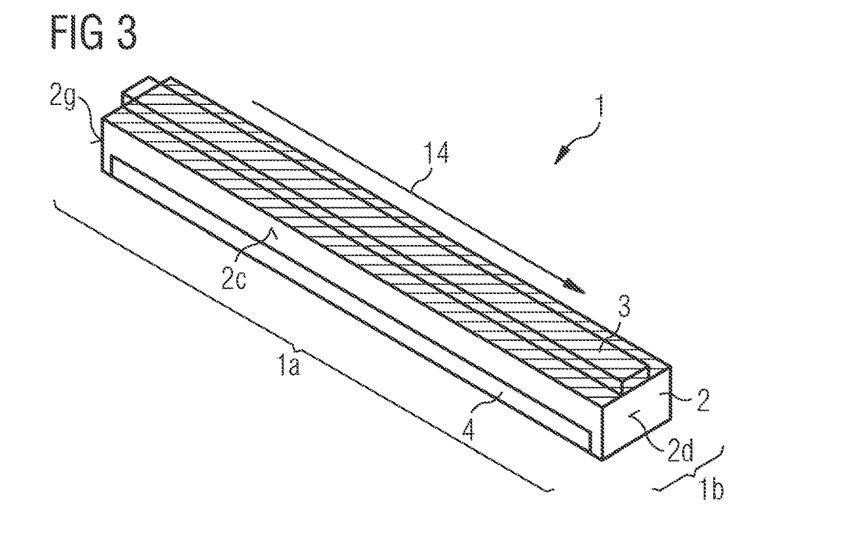
FIG. 3 shows a schematic illustration of one exemplary embodiment of an edge emitting semiconductor laser diode described here.

The schematic sectional illustration in FIG. 3 shows one exemplary embodiment of an edge emitting semiconductor laser diode 1 described here. In contrast to the exemplary embodiment in FIGS. 1 and 2, no filling material 9 is arranged in a first cutout 4. That is to say that the first cutout is free of the filling material 9. A side surface of the semiconductor layer sequence 6 that is recessed by the first cutout 4 has a roughened surface. The roughened surface is configured for example to scatter electromagnetic radiation, in particular visible light. Advantageously, the front surface 2d can thus be controlled particularly well.

Furthermore, a longitudinal direction 14 is identified by an arrow in FIG. 3. In this case, the ridge waveguide 3 extends in the longitudinal direction from a rear side surface 2g to a front surface 2d.

Figure 4:
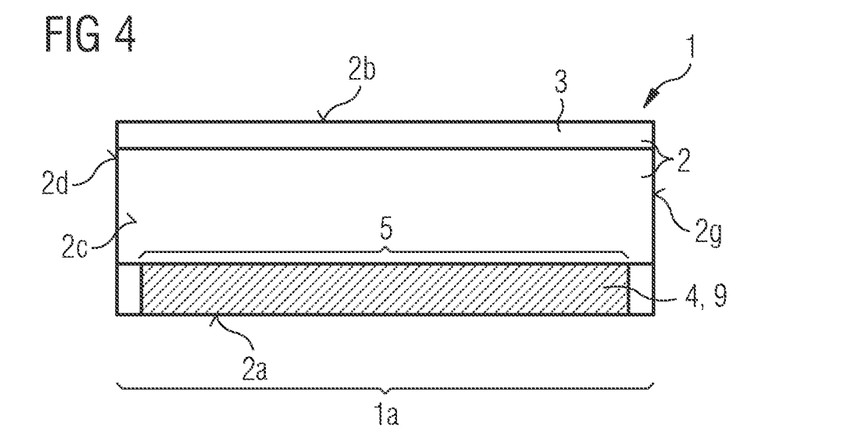
FIGS. 4 and 5 show schematic illustrations of one exemplary embodiment of an edge emitting semiconductor laser diode described here.
Figure 5:
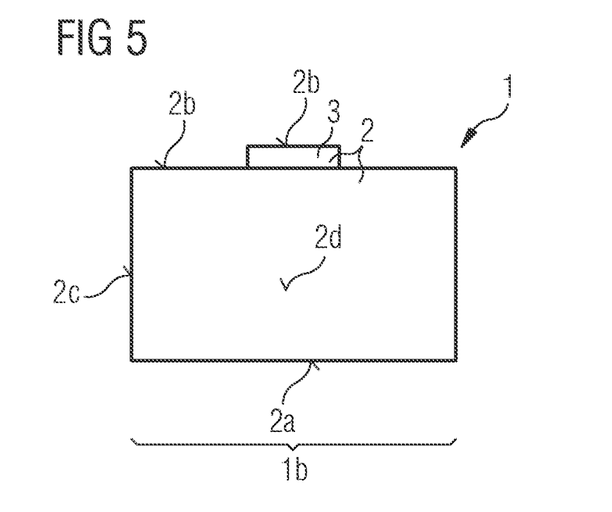

Schematic illustrations of an edge emitting semiconductor laser diode 1 in accordance with one exemplary embodiment are illustrated in accordance with FIGS. 4 and 5.

As illustrated in FIG. 4, in contrast to the exemplary embodiment in FIG. 1, the first cutout 4 extends in places along a length of the semiconductor laser diode 1a. The first cutout 4 here has a length that is less than the length of the semiconductor laser diode 1a. In this exemplary embodiment, the first cutout 4 does not directly adjoin the rear side surface 2g and the front surface 2d of the semiconductor layer sequence 2. That is to say that the first cutout 4 is arranged in a manner spaced apart from the rear side surface 2g and the front surface 2d of the semiconductor layer sequence 2 in the longitudinal direction 14.

In contrast to the exemplary embodiment in FIG. 2, the first cutout 4 in accordance with the exemplary embodiment in FIG. 5 does not expose a recessed front surface of the semiconductor layer sequence 2 since the first cutout 4 is arranged in a manner spaced apart from the front surface 2d in the longitudinal direction 14.

Figure 6:
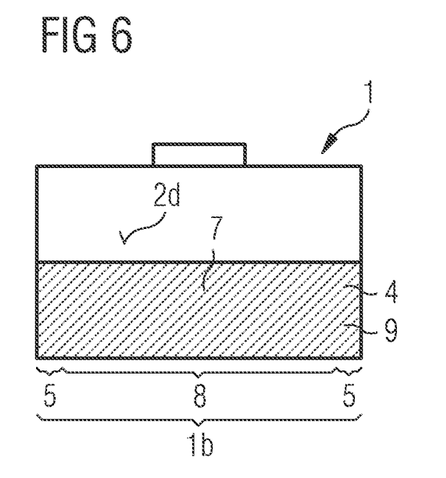
FIG. 6 shows a schematic illustration of one exemplary embodiment of an edge emitting semiconductor laser diode described here.
Figure 7:
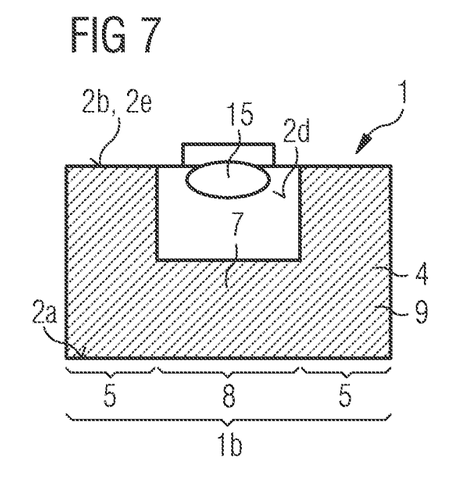
FIG. 7 shows a schematic illustration of one exemplary embodiment of an edge emitting semiconductor laser diode described here.

A front view of the edge emitting semiconductor laser diode 1 is illustrated in accordance with the exemplary embodiment in FIG. 6. In contrast to the exemplary embodiment in FIG. 2, the edge emitting semiconductor laser diode 1 comprises a second cutout 7, which partly penetrates through the semiconductor layer sequence 2 from the bottom surface 2a to the top surface 2b of the semiconductor layer sequence.

A second region of the semiconductor layer sequence 8 is removed from the front surface 2d in the region of the second cutout 7. The second region of the semiconductor layer sequence 8 directly adjoins the first region of the semiconductor layer sequence 5. The second cutout 7 exposes a recessed front surface of the semiconductor layer sequence 2 (not shown here).

The exemplary embodiment in FIG. 6 shows a front view of the edge emitting semiconductor laser diode 1. In contrast to the exemplary embodiment in FIG. 2, the first cutout 4 penetrates completely through the semiconductor layer sequence 2 from the bottom surface 2a to the recessed top surface 2e of the semiconductor layer sequence 2.

The edge emitting semiconductor laser diode 1 emits laser radiation from a facet 15. The facet 15 is formed by a part of the front surface 2d of the semiconductor layer sequence 2. Advantageously, the second cutout 7 penetrates only partly through the semiconductor layer sequence 2 at the front surface 2d, such that the facet 15 cannot be damaged by the cutout.

Figure 8:
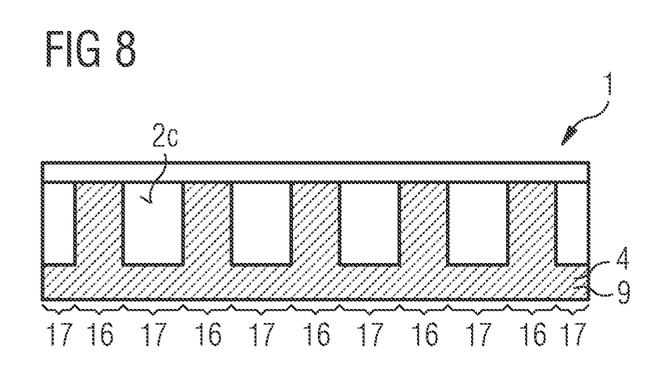
FIG. 8 shows a schematic illustration of one exemplary embodiment of an edge emitting semiconductor laser diode described here.

A side view of the edge emitting semiconductor laser diode 1 is illustrated in accordance with the exemplary embodiment in FIG. 8. As illustrated in FIG. 8, the first cutout 4, in first sectors 16, penetrates partly through the semiconductor layer sequence 2 from the bottom surface 2a to the recessed top surface 2e.

Furthermore, the first cutout 4, in second sectors 17, penetrates completely through the semiconductor layer sequence 2 from the bottom surface 2a to the recessed top surface 2e. The first sectors 16 and the second sectors 17 directly adjoin one another and are arranged alternately in a manner alternating along the length of the edge emitting semiconductor laser diode 1a.

A plan view of a bottom surface of the edge emitting semiconductor laser diode 1 is illustrated in each case in accordance with the exemplary embodiments in FIGS. 9 to 14.

Figure 9:
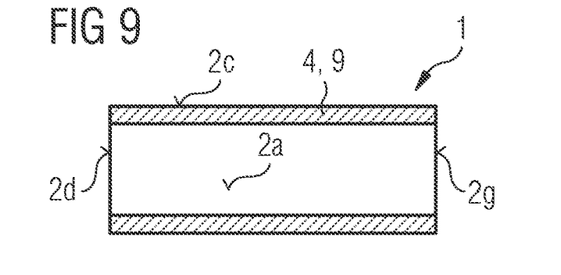
FIGS. 9, 10, 11, 12, 13 and 14 show illustrations in plan view in each case of one exemplary embodiment of an edge emitting semiconductor laser diode described here.

The exemplary embodiment in FIG. 9 together with the exemplary embodiments in FIGS. 1 and 2 forms a common exemplary embodiment. The first cutout 4 extends from the rear side surface 2g to the front side surface.

Figure 10:
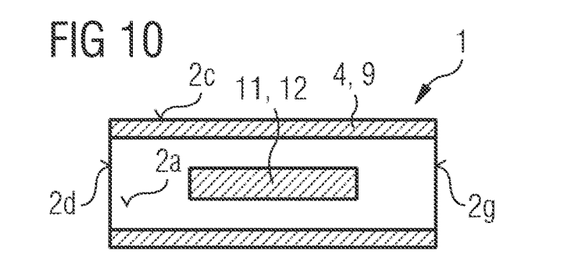

In contrast to the exemplary embodiment in FIG. 9, the edge emitting semiconductor laser diode 1 in accordance with FIG. 10 comprises a third cutout 11. The third cutout 11 extends from the bottom surface 2a toward the top surface 2b of the semiconductor layer sequence 2. The third cutout 11 penetrates only partly through the semiconductor layer sequence 2 and does not penetrate through an active layer of the semiconductor layer sequence 2.

The third cutout 11 here has a quadrilateral shape. A maximum extent in the longitudinal direction 14 of the third cutout 11 is less than the length of the semiconductor laser diode. Furthermore, the third cutout 11 is spaced apart from the first cutout 4 in lateral directions.

A further filling material 12 is arranged in the third cutout 11 and completely fills the third cutouts 11. Furthermore, the third cutout 11 is laterally completely surrounded by a material of the semiconductor layer sequence 2.

Figure 11:
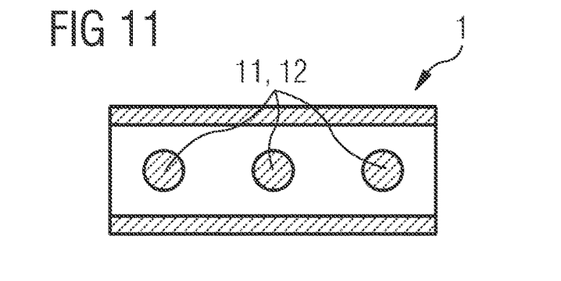

In contrast to the exemplary embodiment in FIG. 10, three third cutouts 11 are arranged in the semiconductor layer sequence 2, as illustrated in FIG. 11. The third cutouts 11 each have a round shape and are arranged in a manner spaced apart from one another in lateral directions. Furthermore, the third cutouts 11 are arranged with equidistant spacings along the longitudinal directions.

Figure 12:
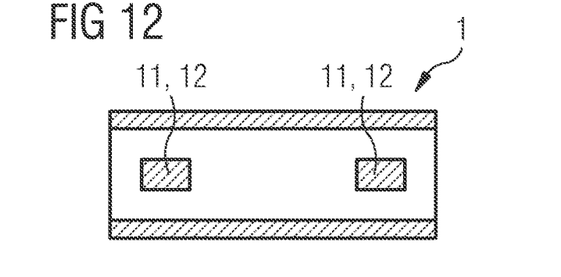

In contrast to the exemplary embodiment in FIG. 11, two third cutouts 11 are arranged in the semiconductor layer sequence 2, as illustrated in FIG. 12. The third cutouts 11 each have a quadrilateral shape.

Figure 13:
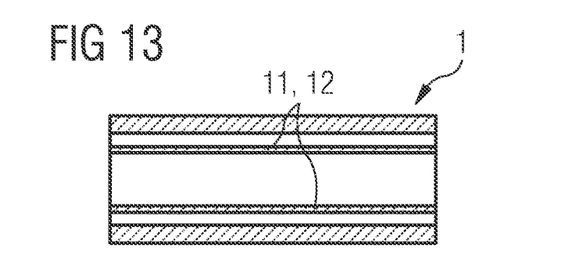

In accordance with the exemplary embodiment in FIG. 13, the third cutouts 11 extend parallel to the longitudinal direction 14. The third cutouts 11 extend completely along a length of the semiconductor laser diode 1a.

Figure 14:
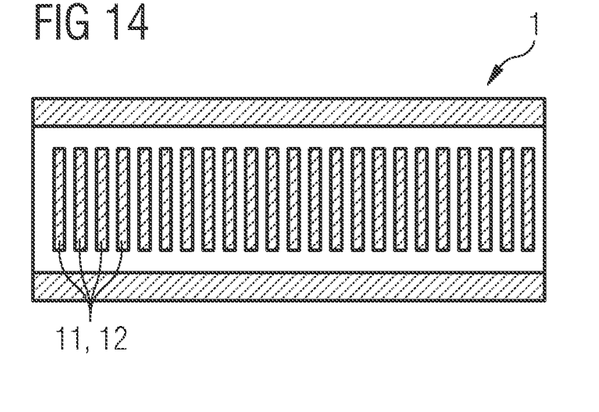

Furthermore, a plurality of third cutouts 11 embodied as strips in each case are arranged in the semiconductor layer sequence 2, as illustrated in FIG. 14. A DFB laser can advantageously be realized by means of the plurality of third cutouts 11 filled with the further filling material 12.

Figure 15:
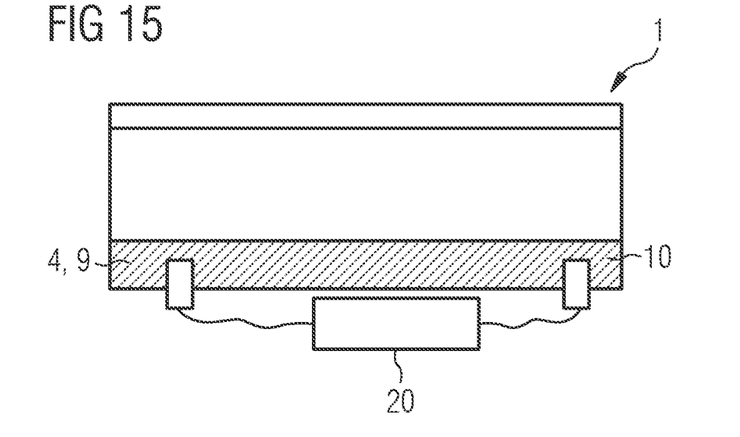
FIGS. 15 and 16 show illustrations in each case of one exemplary embodiment of an edge emitting semiconductor laser diode described here.

A side view of the edge emitting semiconductor laser diode 1 is illustrated in accordance with the exemplary embodiment in FIG. 15. Here, in contrast to the exemplary embodiment in FIG. 1, a sensor element 10 is arranged in the first cutout 4. By way of example, an electrical resistance can be detected by means of the sensor element 10.

The sensor element 10 comprises n-doped silicon, for example. An electrical voltage dropped across the n-doped silicon can then be tapped off by means of a voltage measuring device 20 and the electrical resistance can thus be detected.

Figure 16:
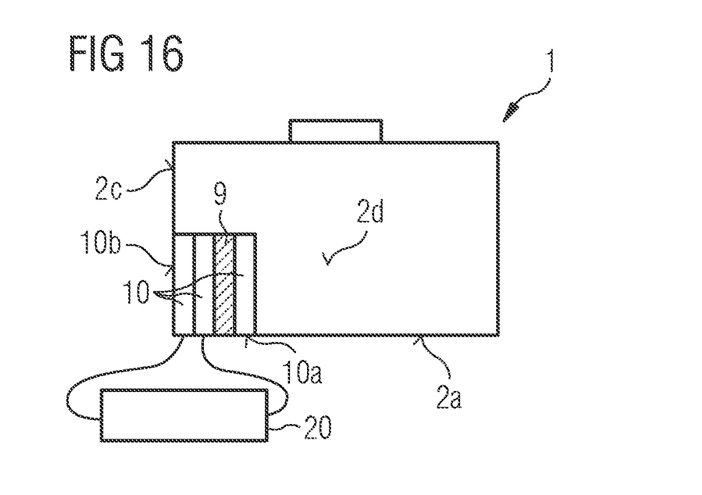

In contrast to the exemplary embodiment in FIG. 15, a plurality of sensor elements 10 are arranged in the first cutout 4, as shown in FIG. 16. The sensor elements 10 are arranged next to one another in lateral directions in the first cutout 4. Bottom surfaces of the sensor elements 10a lie in a common plane with the bottom surface of the semiconductor layer sequence 2a. A side surface of the outermost sensor element 10b facing away from the recessed side surface of the semiconductor layer sequence terminates in planar fashion with the side surface of the semiconductor layer sequence 2c. Besides the sensor elements 10, a filling material 9 is arranged in the cutout.

By way of example, the first two sensor elements 10 facing away from the recessed side surface of the semiconductor layer sequence comprise n-doped silicon and p-doped silicon, for example. The two sensor elements 10 form a semiconductor detector chip, for example, which can detect electromagnetic radiation by means of a measuring device 20. Furthermore, the sensor element 10 facing the recessed side surface of the semiconductor layer sequence is a piezo-element. The mechanical force can be detected by the piezo-element, for example.

In accordance with this exemplary embodiment, the piezo-element and the semiconductor detector chip are separated from one another in an electrically insulating manner by the filling material 9.

Figure 17:
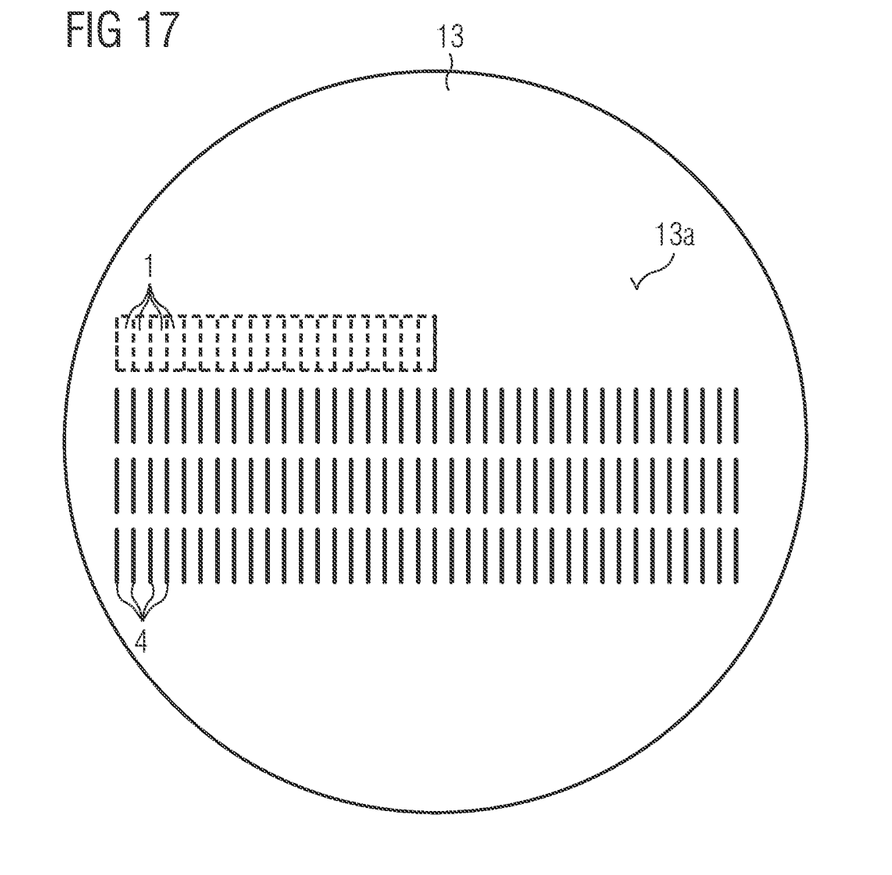
FIG. 17 shows a schematic illustration of a method step of one exemplary embodiment of a method described here for producing a plurality of edge emitting semiconductor laser diodes.

A schematic illustration of a method step of one exemplary embodiment of a method described here for producing a plurality of edge emitting semiconductor laser diodes is illustrated in plan view in accordance with FIG. 17.

Firstly, a semiconductor wafer 13 is provided, comprising a bottom surface 13a and a plurality of ridge waveguides 3 at a top surface 13b facing away from the bottom surface 13a.

In this method step, a plurality of first cutouts 4 are produced proceeding from the bottom surface of the semiconductor wafer 13a. The first cutouts 4 extend from the bottom surface 13a toward the top surface 13b. Dimensions in lateral directions of the semiconductor laser diodes 1 to be produced are illustrated by way of example using dashed lines on the bottom surface of the semiconductor wafer 13a.

The semiconductor wafer 13 is subsequently singulated to form semiconductor laser diodes 1 through the first cutouts (not shown here).

The features and exemplary embodiments described in association with the figures can be combined with one another in accordance with further exemplary embodiments, even though not all combinations are explicitly described. Furthermore, the exemplary embodiments described in association with the figures can alternatively or additionally have further features in accordance with the description in the general part.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An edge emitting semiconductor laser diode comprising:
   a semiconductor layer sequence comprising a bottom surface, a ridge waveguide at a top surface facing away from the bottom surface, and a side surface arranged transversely with respect to the top surface, and
   a first cutout extending from the bottom surface toward the top surface, wherein
   a first region of the semiconductor layer sequence is removed from the side surface in the region of the first cutout,
   in plan view the first cutout does not overlap the ridge waveguide in lateral directions, a filling material is arranged in the first cutout,
the filling material comprises a radiation-absorbing material or a radiation-reflecting material, and
the filling material is electrically insulating.

2. The edge emitting semiconductor laser diode as claimed in claim 1,
wherein a side surface of the semiconductor layer sequence that is recessed by the first cutout has a roughened surface.

3. The edge emitting semiconductor laser diode as claimed in claim 1,
wherein the first cutout extends in places along a length of the semiconductor laser diode.

4. The edge emitting semiconductor laser diode as claimed in claim 3,
wherein the first cutout extends completely along a length of the semiconductor laser diode.

5. The edge emitting semiconductor laser diode as claimed in claim 4, wherein
a second cutout extends from the bottom surface toward the top surface of the semiconductor layer sequence,
a second region of the semiconductor layer sequence is removed from a front surface in the region of the second cutout, said second region adjoining the first region, and
the second cutout extends in places along a width of the semiconductor laser diode.

6. The edge emitting semiconductor laser diode as claimed in claim 5,
wherein in plan view the ridge waveguide regionally overlaps the second cutout in lateral directions.

7. The edge emitting semiconductor laser diode as claimed in claim 1,
wherein the filling material has a refractive index which is different than a refractive index of the semiconductor layer sequence.

8. The edge emitting semiconductor laser diode as claimed in claim 1,
wherein the filling material comprises a conversion material configured to convert laser radiation into electromagnetic secondary radiation of a different wavelength.

9. The edge emitting semiconductor laser diode as claimed in claim 1,
wherein there is arranged in the first cutout at least one sensor element configured to detect at least one of the following variables: electromagnetic radiation, electrical resistance, mechanical force, temperature.

10. The edge emitting semiconductor laser diode as claimed in claim 1, wherein
a third cutout extends from the bottom surface toward the top surface of the semiconductor layer sequence, and
the third cutout is laterally completely surrounded by a material of the semiconductor layer sequence.

11. The edge emitting semiconductor laser diode as claimed in claim 10,
wherein in plan view the third cutout overlaps the ridge waveguide.

12. The edge emitting semiconductor laser diode as claimed in claim 10,
wherein a further filling material is arranged in the third cutout.

13. An edge emitting semiconductor laser diode comprising:
a semiconductor layer sequence comprising a bottom surface, a ridge waveguide at a top surface facing away from the bottom surface, and a side surface arranged transversely with respect to the top surface, and
a first cutout extending from the bottom surface toward the top surface, wherein
a first region of the semiconductor layer sequence is removed from the side surface in the region of the first cutout,
in plan view the first cutout does not overlap the ridge waveguide in lateral directions,
a filling material is arranged in the first cutout,
the filling material comprises a radiation-absorbing material or a radiation-reflecting material, and
there is arranged in the first cutout at least one sensor element configured to detect at least one of the following variables: electromagnetic radiation, electrical resistance, mechanical force, temperature.

14. An edge emitting semiconductor laser diode comprising:
a semiconductor layer sequence comprising a bottom surface, a ridge waveguide at a top surface facing away from the bottom surface, and a side surface arranged transversely with respect to the top surface, and
a first cutout extending from the bottom surface toward the top surface, wherein
a first region of the semiconductor layer sequence is removed from the side surface in the region of the first cutout,
in plan view the first cutout does not overlap the ridge waveguide in lateral directions,
a filling material is arranged in the first cutout,
the filling material comprises a radiation-absorbing material or a radiation-reflecting material,
a third cutout extends from the bottom surface toward the top surface of the semiconductor layer sequence, and
the third cutout is laterally completely surrounded by a material of the semiconductor layer sequence.

15. The edge emitting semiconductor laser diode as claimed in claim 14,
wherein in plan view the third cutout overlaps the ridge waveguide.

16. The edge emitting semiconductor laser diode as claimed in claim 14,
wherein a further filling material is arranged in the third cutout.

* * * * *

UNITED STATES PATENT AND TRADEMARK OFFICE
CERTIFICATE OF CORRECTION

| | |
|---|---|
| PATENT NO. | : 12,261,409 B2 |
| APPLICATION NO. | : 17/441868 |
| DATED | : March 25, 2025 |
| INVENTOR(S) | : Sven Gerhard et al. |

It is certified that error appears in the above-identified patent and that said Letters Patent is hereby corrected as shown below:

On the Title Page

Item (73) Assignee, "OSRAM Opto Semiconductors Gmb" should be --OSRAM Opto Semiconductors GmbH--

Signed and Sealed this
Twenty-ninth Day of April, 2025

Coke Morgan Stewart
*Acting Director of the United States Patent and Trademark Office*